United States Patent
Taguchi et al.

(10) Patent No.: US 10,892,738 B2
(45) Date of Patent: Jan. 12, 2021

(54) ACOUSTIC WAVE FILTER DEVICE AND MULTIPLEXER

(71) Applicant: Murata Manufacturing Co., Ltd., Nagaokakyo (JP)

(72) Inventors: Tomoko Taguchi, Nagaokakyo (JP); Shinichi Nakamura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/386,297

(22) Filed: Apr. 17, 2019

(65) Prior Publication Data

US 2019/0245516 A1    Aug. 8, 2019

Related U.S. Application Data

(63) Continuation of application No. PCT/JP2017/037745, filed on Oct. 18, 2017.

(30) Foreign Application Priority Data

Nov. 8, 2016    (JP) .................................. 2016-218368

(51) Int. Cl.
*H03H 9/64*     (2006.01)
*H03H 9/72*     (2006.01)
(Continued)

(52) U.S. Cl.
CPC ............ *H03H 9/6463* (2013.01); *H03H 9/25* (2013.01); *H03H 9/545* (2013.01); *H03H 9/6466* (2013.01); *H03H 9/6483* (2013.01)

(58) Field of Classification Search
CPC ............. H03H 9/64; H03H 9/72; H03H 9/725
(Continued)

(56) References Cited

U.S. PATENT DOCUMENTS 6,380,827 B1    4/2002  Noguchi
2011/0193654 A1  8/2011  Miyake
(Continued)

FOREIGN PATENT DOCUMENTS

JP    2000-349591 A    12/2000
WO    2010/052969 A1    5/2010
(Continued)

OTHER PUBLICATIONS

Official Communication issued in International Patent Application No. PCT/JP2017/037745, dated Jan. 9, 2018.

*Primary Examiner* — Dean O Takaoka
(74) *Attorney, Agent, or Firm* — Keating & Bennett, LLP

(57) ABSTRACT

A reception filter includes a parallel arm resonator, a first longitudinally coupled resonance device including first acoustic wave resonators, and a second longitudinally coupled resonance device including second acoustic wave resonators, and cascade-connected to the first longitudinally coupled resonance device. Each of the first and second acoustic wave resonators include one end connected to a ground, the parallel arm resonator and the first and second longitudinally coupled resonance devices are provided on a piezoelectric substrate, and a ground to which the parallel arm resonator is connected, a ground to which at least one of the first acoustic wave resonators is connected, and a ground to which at least one of the second acoustic wave resonators is connected are commonly connected on the piezoelectric substrate.

14 Claims, 4 Drawing Sheets

(51) Int. Cl.
*H03H 9/54* (2006.01)
*H03H 9/25* (2006.01)

(58) Field of Classification Search
USPC .................................................. 333/133, 193
See application file for complete search history.

(56) References Cited

U.S. PATENT DOCUMENTS

| | | | |
|---|---|---|---|
| 2013/0307639 A1* | 11/2013 | Mori ..................... | H03H 9/725 |
| | | | 333/133 |
| 2016/0173061 A1 | 6/2016 | Takamine | |
| 2017/0194939 A1* | 7/2017 | Mukai ..................... | H03H 9/64 |
| 2017/0222625 A1* | 8/2017 | Nakamura ............... | H03H 9/25 |
| 2018/0138892 A1* | 5/2018 | Caron ..................... | H04L 5/001 |

FOREIGN PATENT DOCUMENTS

| | | | | |
|---|---|---|---|---|
| WO | 2015/040921 A1 | 3/2015 | | |
| WO | WO-2015040922 A1 * | 3/2015 | ........... | H03H 9/6433 |
| WO | WO-2016056377 A1 * | 4/2016 | ............... | H03H 9/64 |
| WO | WO-2016067873 A1 * | 5/2016 | ............... | H03H 9/25 |

\* cited by examiner

ACOUSTIC WAVE FILTER DEVICE AND MULTIPLEXER

CROSS REFERENCE TO RELATED APPLICATIONS

This application claims the benefit of priority to Japanese Patent Application No. 2016-218368 filed on Nov. 8, 2016 and is a Continuation Application of PCT Application No. PCT/JP2017/037745 filed on Oct. 18, 2017. The entire contents of each of these applications are hereby incorporated herein by reference.

BACKGROUND OF THE INVENTION

1. Field of the Invention

The present invention relates to an acoustic wave filter device including a longitudinally coupled resonance device, and a multiplexer.

2. Description of the Related Art

Conventionally, an acoustic wave filter device has been proposed in which a plurality of longitudinally coupled resonance devices are cascade-connected for ensuring an attenuation amount outside a pass band, as a reception filter or the like of a duplexer, in particular (see, for example, International Publication No. 2015/040921).

In such an acoustic wave filter device, in order to improve the attenuation amount outside the pass band, it is common to isolate grounds connected to each of the longitudinally coupled resonance devices cascade-connected without being commonly connected. In other words, on a substrate of the acoustic wave filter device, the ground connected to one longitudinally coupled resonance device and the ground connected to the other longitudinally coupled resonance device are not connected to each other but are independently disposed. However, since such a configuration has difficulty in reducing the number of ground terminals for external connection of the acoustic wave filter device, it is difficult to reduce the size of the acoustic wave filter device.

SUMMARY OF THE INVENTION

Preferred embodiments of the present invention provide small-sized acoustic wave filter devices and multiplexers, each of which are able to improve an attenuation amount outside a pass band.

An acoustic wave filter device according to a preferred embodiment of the present invention includes a parallel arm resonator that is connected between ground and a transmission path of a high-frequency signal, which connects a first terminal and a second terminal to or from which the high-frequency signal is input or output, a first longitudinally coupled resonance device that includes a plurality of first acoustic wave resonators disposed side by side in a propagation direction of acoustic waves and is provided on the transmission path, and a second longitudinally coupled resonance device that includes a plurality of second acoustic wave resonators disposed side by side in the propagation direction of the acoustic waves and is cascade-connected to the first longitudinally coupled resonance device, wherein each of the plurality of first acoustic wave resonators and each of the plurality of second acoustic wave resonators include one end connected to ground, the parallel arm resonator, the first longitudinally coupled resonance device, and the second longitudinally coupled resonance device are provided on one substrate having piezoelectricity, and the ground to which the parallel arm resonator is connected, the ground to which at least one of the plurality of first acoustic wave resonators is connected, and the ground to which at least one of the plurality of second acoustic wave resonators is connected are commonly connected on the substrate.

With this configuration, it is possible to improve an attenuation amount while shifting, to the low frequency side, an attenuation pole of an acoustic wave filter, particularly, an attenuation pole on the lower frequency side than a pass band by a combined inductance component of an inductance component by a commonly connected ground wiring and an inductance component by a bonding wire or other suitable structure connecting the wiring and a ground potential outside the substrate. In other words, the inductance components (parallel inductance components) provided between the elements (parallel arm resonator, first longitudinally coupled resonance device, and second longitudinally coupled resonance device) and the ground potential are able to effectively function. Accordingly, it is possible to achieve a small-sized acoustic wave filter device which is able to improve the attenuation amount outside the pass band.

In addition, the ground to which the parallel arm resonator is connected, the ground to which each of the plurality of first acoustic wave resonators is connected, and the ground to which each of the plurality of second acoustic wave resonators is connected may be commonly connected on the substrate.

With this configuration, it is possible to achieve a small-sized acoustic wave filter device which is able to further improve the attenuation amount outside the pass band.

The second longitudinally coupled resonance device may be defined by a third longitudinally coupled resonance device and a fourth longitudinally coupled resonance device which are connected in parallel to each other on the transmission path, the third longitudinally coupled resonance device may include a portion of the plurality of second acoustic wave resonators, the fourth longitudinally coupled resonance device may include at least another portion of the plurality of second acoustic wave resonators, and the ground to which at least one of the plurality of second acoustic wave resonators that the third longitudinally coupled resonance device includes is connected and the ground to which at least one of the plurality of second acoustic wave resonators that the fourth longitudinally coupled resonance device includes is connected may be commonly connected on the substrate.

With this configuration, even when the second longitudinally coupled resonance device is defined by a plurality of longitudinally coupled resonance devices connected in parallel to each other (that is, is divided in parallel), a small-sized acoustic wave filter device which is able to improve the attenuation amount outside the pass band is achieved.

Each of the plurality of first acoustic wave resonators and each of the plurality of second acoustic wave resonators may include IDT (InterDigital Transducer) electrodes to excite surface acoustic waves.

With this configuration, it is possible to achieve a small-sized and low-height acoustic wave filter device having highly steep bandpass characteristics.

An acoustic wave filter device according to a preferred embodiment of the present invention may further include a series arm resonator that is provided on the transmission path and is connected to the parallel arm resonator with no acoustic wave resonator interposed therebetween.

With this configuration, characteristics of a ladder circuit are added to characteristics of the longitudinally coupled resonance devices, so that it is possible to improve attenuation characteristics outside the pass band, for example, the obtain steep attenuation characteristics.

A multiplexer according to a preferred embodiment of the present invention includes a plurality of filter devices that are commonly connected at a common connection point, wherein the plurality of filter devices include an acoustic wave filter device according to a preferred embodiment of the present invention including the first terminal connected to the common connection point.

With this configuration, by providing the small-sized acoustic wave filter device which is able to improve the attenuation amount outside the pass band as described above, a small-sized multiplexer capable of improving isolation characteristics is achieved.

A multiplexer according to a preferred embodiment of the present invention includes a plurality of filter devices that are commonly connected at a common connection point, wherein the plurality of filter devices include an acoustic wave filter device according to a preferred embodiment including the first terminal connected to the common connection point, and the series arm resonator includes one end connected to the first terminal with no acoustic wave resonator interposed therebetween and the other end connected to the parallel arm resonator.

With this configuration, the one end of one series arm resonator is connected to the common connection point with no acoustic wave resonator interposed therebetween. In other words, by providing the series arm resonator at a position closest to the common connection point among the plurality of acoustic wave resonators defining one filter device, isolation in pass bands of the other filter devices connected at the common connection point is able to be further improved.

According to preferred embodiments of the present invention, it is possible to provide small-sized acoustic wave filter devices and multiplexers which are each able to improve an attenuation amount outside a pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
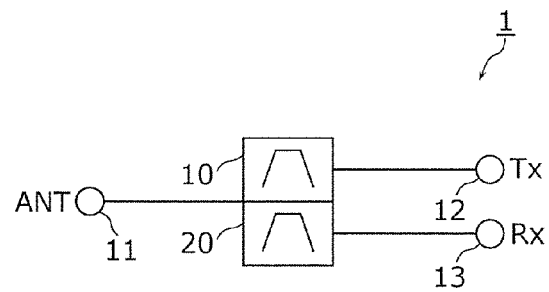
FIG. 1 is a configuration diagram of a duplexer according to a preferred embodiment of the present invention.

Hereinafter, preferred embodiments of the present invention will be described in detail with reference to the accompanying drawings. The preferred embodiments, which will be described below, represent comprehensive or specific examples. Numerical values, shapes, materials, components, arrangement and connection structures of the components, and other features and elements, which will be described in the following preferred embodiments, are merely examples and are not intended to limit the scope of the present invention. Components in the following preferred embodiments, which are not described in independent claims, will be explained as optional components. Sizes or size ratios of the components illustrated in the drawings are not necessarily critical. In each of the drawings, the same reference numerals denote the same or substantially the same configurations, and repetitive description thereof may be omitted or simplified.

First, before describing an acoustic wave filter device according to a preferred embodiment of the present invention, the configuration of a multiplexer including an acoustic wave filter device will be described using a duplexer as an example.

FIG. 1 is a configuration diagram of a duplexer 1 according to a preferred embodiment of the present invention.

The duplexer 1 illustrated in FIG. 1 is a multiplexer including a transmission filter 10 and a reception filter 20 having different pass bands. The duplexer 1 demultiplexes and filters high-frequency signals (in this example, a high-frequency transmission signal and a high-frequency reception signal) of Bands (frequency band) defined by the 3GPP (Third Generation Partnership Project), for example, for transmission.

The duplexer 1 according to the present preferred embodiment preferably supports Band 28A, for example, wherein the pass band of the transmission filter 10 is a transmission band of Band 28A (about 703 MHz to about 733 MHz) and the pass band of the reception filter 20 is a reception band of Band 28A (about 758 MHz to about 788 MHz). Note that the high-frequency signals to be demultiplexed and filtered by the duplexer 1 are not particularly limited and may be high-frequency signals defined by a communication standard different from the 3GPP described above.

The transmission filter 10 is a filter device provided in a transmission path of the high-frequency signal (in this case, a transmission path of the high-frequency transmission signal) connecting an ANT terminal 11 (antenna terminal) as a common terminal and a Tx terminal 12 (transmission terminal) as an individual terminal. The transmission filter 10 is preferably defined by, for example, a ladder acoustic wave filter device. Note that the transmission filter 10 is not limited to the acoustic wave filter device and may be, for example, an LC resonance filter, a dielectric filter, or other suitable filter.

The reception filter 20 is an acoustic wave filter device provided in a transmission path of the high-frequency signal (in this case, transmission path of the high-frequency reception signal) connecting ANT terminal 11 as the common terminal and an Rx terminal 13 (reception terminal) as an individual terminal. In the present preferred embodiment, the reception filter 20 is preferably, for example, an acoustic wave filter device in which a plurality of longitudinally coupled resonance devices that are cascade-connected and a ladder circuit are combined. The detailed configuration of the reception filter 20 will be described below.

The above-described duplexer 1 is disposed, for example, in a front end portion of a communication apparatus, and filters, by the transmission filter 10, the high-frequency signal input from an RFIC (Radio Frequency Integrated Circuit, not illustrated) to the Tx terminal 12 with a transmission amplification circuit, such as a power amplifier, interposed therebetween and outputs the filtered signal from the ANT terminal 11 to an antenna element (not illustrated). The high-frequency signal received by the antenna element and input to the ANT terminal 11 is filtered by the reception filter 20 and is output from the Rx terminal 13 to the RFIC with a reception amplification circuit, such as a low noise amplifier, interposed therebetween.

Figure 2:
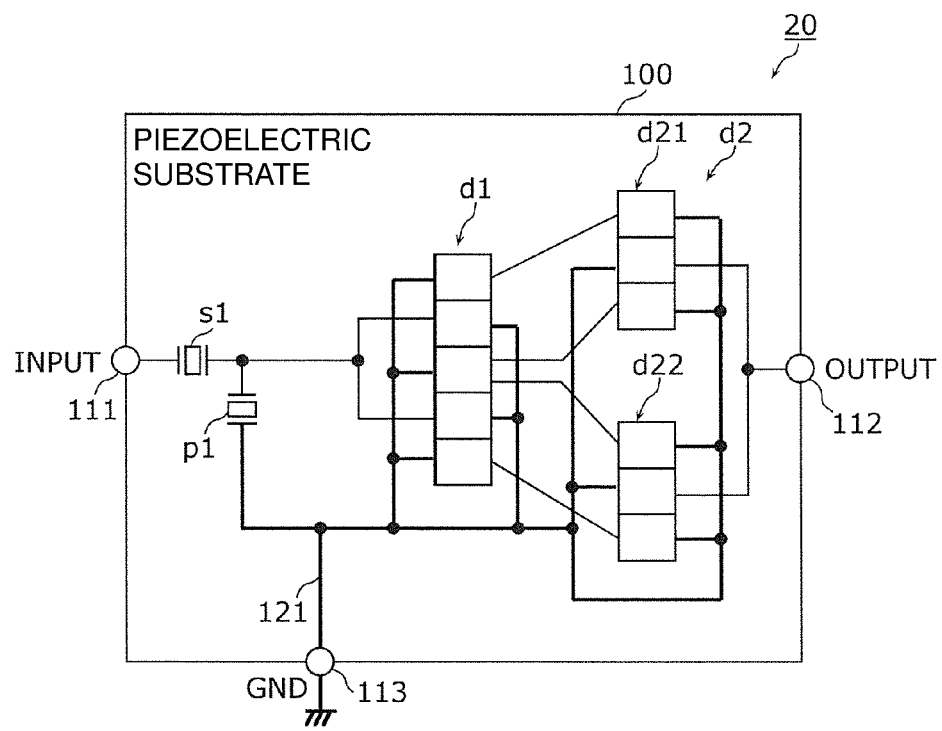
FIG. 2 is a schematic diagram illustrating the configuration of a reception filter according to a preferred embodiment of the present invention.

FIG. 2 is a schematic diagram illustrating the configuration of the reception filter 20 according to the present preferred embodiment. FIG. 2 schematically illustrates a connection relationship among elements of the reception filter 20 on a piezoelectric substrate 100. Terminals connected by one wiring in FIG. 2 are electrically connected on the piezoelectric substrate 100. For example, grounds for each of the acoustic wave resonators, which are connected by a GND wiring 121, are commonly connected to a GND terminal 113 (ground terminal) for external connection on the piezoelectric substrate 100. The GND terminal 113 is preferably, for example, a pad electrode provided on the piezoelectric substrate 100. In FIG. 2, each of the rectangular or substantially rectangular shapes in longitudinally coupled resonance devices d1 and d2, which will be described later, schematically represent resonators. These matters are also applied to the subsequent schematic diagrams.

As illustrated in FIG. 2, the reception filter 20 includes a series arm resonator s1 and a parallel arm resonator p1, and the longitudinally coupled resonance devices d1 and d2.

The series arm resonator s1 is preferably, for example, an acoustic wave resonator provided on a transmission path (i.e., series arm) of the high-frequency signal, which connects an INPUT terminal 111 (first terminal) to which the high-frequency signal (in this case, high-frequency reception signal) is input and an OUTPUT terminal 112 (second terminal) from which the high-frequency signal is output. The series arm resonator s1 is connected to the parallel arm resonator p1 with no acoustic wave resonator interposed therebetween. For example, preferably, the series arm resonator s1 has a resonance point within the pass band of the reception filter 20 and has an anti-resonance point in a higher frequency band than the pass band. The resonance point is a singularity point at which an impedance is minimum (ideally, a point at which impedance is 0), and the anti-resonance point is a singularity point at which the impedance is maximum (ideally, a point at which impedance is infinite). In other words, the series arm resonator s1 defines the pass band of the reception filter 20 and an attenuation pole on the higher frequency side than the pass band.

Specifically, one end of the series arm resonator s1 is connected to the INPUT terminal 111 (first terminal), and the other end thereof is connected to the parallel arm resonator p1. In other words, the series arm resonator s1 is an acoustic wave resonator which is connected closest to the INPUT terminal 111 among the plurality of acoustic wave resonators defining the reception filter 20. That is to say, the series arm resonator s1 is connected closest to the ANT terminal 11 (common connection point) among the plurality of acoustic wave resonators.

The parallel arm resonator p1 is connected between the transmission path and the ground. In other words, the parallel arm resonator p1 is an acoustic wave resonator provided on a transmission path (i.e., a parallel arm) connecting the transmission path (series arm) and the ground. For example, preferably, the parallel arm resonator p1 has a resonance point on a lower frequency side than the pass band of the reception filter 20 and has an anti-resonance point within the pass band. In other words, the parallel arm resonator p1 defines an attenuation pole on the lower frequency side than the pass band of the reception filter 20 and the pass band.

The series arm resonator s1 and the parallel arm resonator p1 define a ladder filter circuit.

The longitudinally coupled resonance devices d1 and d2 are cascade-connected and provided on the transmission path (series arm). In other words, an output terminal of the longitudinally coupled resonance device d1 is connected to an input terminal of the longitudinally coupled resonance device d2.

The longitudinally coupled resonance device d1 is a first longitudinally coupled resonance device that includes a plurality of acoustic wave resonators (a plurality of first acoustic wave resonators) disposed side by side in the propagation direction of acoustic waves and is provided on the transmission path. In the present preferred embodiment, the longitudinally coupled resonance device d1 preferably includes, for example, five acoustic wave resonators. It is sufficient that the number of acoustic wave resonators of the longitudinally coupled resonance device d1 is equal to or greater than 2 and it may be appropriately determined depending on required specifications and characteristics.

The longitudinally coupled resonance device d2 is a second longitudinally coupled resonance device that includes a plurality of acoustic wave resonators (a plurality of second acoustic wave resonators) disposed side by side in the propagation direction of the acoustic waves and is provided on the transmission path. In the present preferred embodiment, the longitudinally coupled resonance device d2 includes a longitudinally coupled resonance device d21 (third longitudinally coupled resonance device) and a longitudinally coupled resonance device d22 (fourth longitudinally coupled resonance device), which are connected in parallel to each other on the transmission path. Specifically, each of the longitudinally coupled resonance devices d21 and d22 includes (n+1)/2 (three in the preferred embodiment) acoustic wave resonators while an acoustic wave resonator located at the center in the propagation direction of the acoustic waves among n (for example, five in the preferred embodiment) acoustic wave resonators as the same number thereof in the longitudinally coupled resonance device d1 is divided in the propagation direction. In other words, the longitudinally coupled resonance device d21 (third longitudinally coupled resonance device) includes a portion of a plurality of acoustic wave resonators (a plurality of second acoustic wave resonators) of the longitudinally coupled resonance device d2, and the longitudinally coupled resonance device (fourth longitudinally coupled resonance device) includes at least another portion of the plurality of acoustic wave resonators.

The longitudinally coupled resonance devices d1 and d2 have resonance points within the pass band of the reception filter 20. In other words, the longitudinally coupled resonance devices d1 and d2 define the pass band of the receive filter 20 and suppress high-frequency signals outside the pass band. Since the longitudinally coupled resonance devices d1 and d2 are cascade-connected, it is possible to achieve a larger attenuation amount outside the pass band. That is to say, the longitudinally coupled resonance devices d1 and d2 are able to improve (increase) the attenuation amount in attenuation bands of the reception filter 20.

In the reception filter 20 having the circuit configuration as described above, the parallel arm resonator p1, the longitudinally coupled resonance device d1 (first longitudinally coupled resonance device), and the longitudinally coupled resonance device d2 (second longitudinally coupled resonance device) are provided on the piezoelectric substrate 100 as one substrate having piezoelectricity. In the present preferred embodiment, the series arm resonator s1 is also provided on the piezoelectric substrate 100. In other words, the reception filter 20 is defined by the plurality of acoustic wave resonators provided on the one piezoelectric substrate 100.

The piezoelectric substrate 100 is preferably, for example, a piezoelectric substrate made of LiTaO$_3$ piezoelectric single crystal, LiNbO$_3$ piezoelectric single crystal, KNbO$_3$ piezoelectric single crystal, quartz crystal, or piezoelectric ceramics. Note that the piezoelectric substrate 100 is not limited to a single layer substrate and may be a multilayer substrate in which a piezoelectric film made of LiTaO$_3$ piezoelectric single crystal, LiNbO$_3$ piezoelectric single crystal, KNbO$_3$ piezoelectric single crystal, quartz crystal, or piezoelectric ceramics is laminated on a support substrate such as a silicon substrate, for example.

On the piezoelectric substrate 100, the ground of the parallel arm resonator p1, the ground of the longitudinally coupled resonance device d1, and the ground of the longitudinally coupled resonance device d2 are commonly connected. In other words, the ground to which the parallel arm resonator p1 is connected, the ground to which at least one of the plurality of acoustic wave resonators (first acoustic wave resonators) of the longitudinally coupled resonance device d1 is connected, and the ground to which at least one of the plurality of acoustic wave resonators (the plurality of second acoustic wave resonators) of the longitudinally coupled resonance device d2 is connected are commonly connected on the piezoelectric substrate 100. In the present preferred embodiment, the ground to which the parallel arm resonator p1 is connected, the ground to which each of the plurality of acoustic wave resonators of the longitudinally coupled resonance device d1 is connected, and the ground to which each of the plurality of acoustic wave resonators of the longitudinally coupled resonance device d2 is connected are commonly connected on the piezoelectric substrate 100. In other words, all of the grounds to which the plurality of acoustic wave resonators of the reception filter 20 are connected are commonly connected to one GND terminal 113. Specifically, these grounds are commonly connected to the GND terminal 113 and are connected to one another with the GND wiring 121 (ground wiring) interposed therebetween.

As described above, in the present preferred embodiment, the longitudinally coupled resonance device d2 includes the longitudinally coupled resonance device d21 (third longitudinally coupled resonance device) and the longitudinally coupled resonance device d22 (fourth longitudinally coupled resonance device) connected in parallel. In this configuration, the ground to which at least one of the acoustic wave resonators of the longitudinally coupled resonance device d21 (third longitudinally coupled resonance device) among the plurality of acoustic wave resonators (the plurality of second acoustic wave resonators) of the longitudinally coupled resonance device d2 is connected and the ground to which at least one of the acoustic wave resonators of the longitudinally coupled resonance device d22 (fourth longitudinally coupled resonance device) among them is connected are connected on the piezoelectric substrate 100. Specifically, in the present preferred embodiment, the ground to which each of the plurality of (in this case, three) acoustic wave resonators of the longitudinally coupled resonance device d21 is connected and the ground to which each of the plurality of (in this case, three) acoustic wave resonators of the longitudinally coupled resonance device d22 is connected are commonly connected to one GND terminal 113.

Here, the configuration of the acoustic wave resonators defining the reception filter 20 will be described.

In the present preferred embodiment, the reception filter 20 preferably includes acoustic wave resonators using SAW (Surface Acoustic Wave), for example. Such acoustic wave resonators includes IDT (InterDigital Transducer) electrodes which excite surface acoustic waves on the piezoelectric substrate 100. Thus, since the reception filter 20 is able to be defined by the IDT electrodes provided on the piezoelectric substrate 100, the small-sized and low-height reception filter 20 having highly steep bandpass characteristics is achieved.

Hereinafter, the electrode structure of the IDT electrodes will be described using the longitudinally coupled resonance device d1 as an example.

Figure 3:
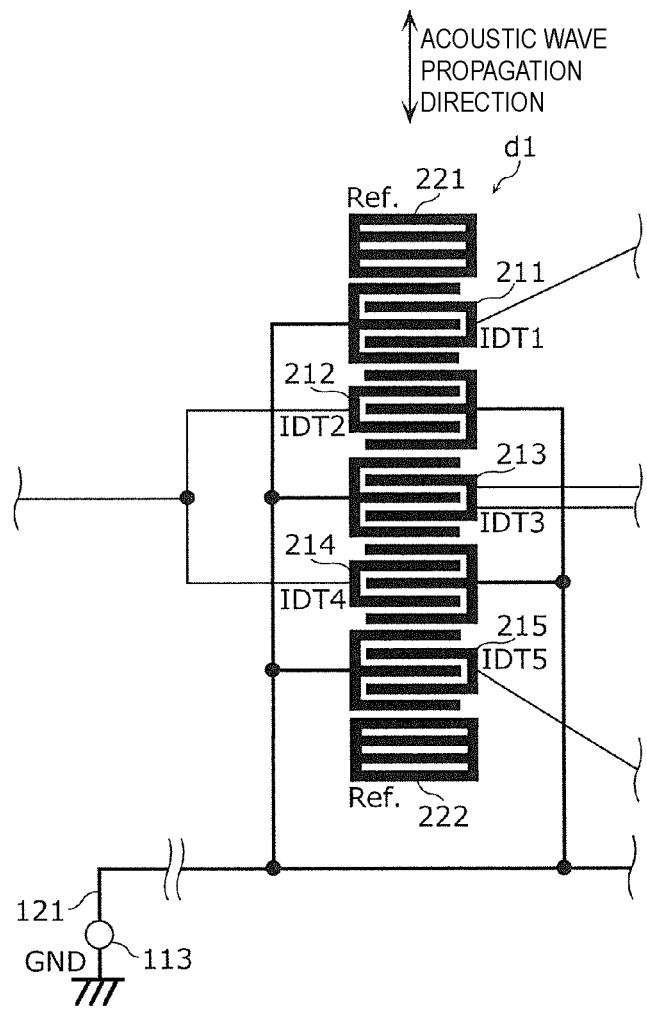
FIG. 3 is a plan view schematically illustrating an electrode structure of a longitudinally coupled resonance device according to a preferred embodiment of the present invention.

FIG. 3 is a plan view schematically illustrating the electrode structure of the longitudinally coupled resonance device d1 according to the present preferred embodiment. Note that the electrode structure illustrated in FIG. 3 is used to describe a typical structure of each of the acoustic wave resonators of the reception filter 20. Therefore, the number, the length, and other parameters of the electrode fingers of the IDT electrodes of the longitudinally coupled resonance device d1 are not limited to the number, the length, and other parameters of the electrode fingers illustrated in FIG. 3. Although FIG. 3 schematically illustrates signal wirings to transmit a high-frequency signal to signal terminals of the IDT electrodes and the GND wiring 121 connecting the grounds of the IDT electrodes and the GND terminal 113, line widths, arrangement layouts, and other parameters of the signal wirings and the GND wiring 121 are not particularly limited and may be appropriately determined according to, for example, the required specification and size of the reception filter 20.

As illustrated in FIG. 3, the longitudinally coupled resonance device d1 is preferably an unbalanced-type DMS (Double Mode SAW (Surface Acoustic Wave)) filter including a plurality of IDT electrodes disposed side by side along the propagation direction of the acoustic waves (in the up-down direction of a paper plane in FIG. 3). In the present preferred embodiment, the longitudinally coupled resonance device d1 preferably includes, for example, five IDT electrodes 211 to 215 (IDT 1 to 5) and a pair of reflectors (Ref.) 221 and 222 disposed on both sides of the IDT electrodes 211 to 215 in the propagation direction of the acoustic waves. It should be noted that the reflectors 221 and 222 need not be provided.

Each of the IDT electrodes 211 to 215 includes a pair of comb-teeth electrodes facing each other. The pair of comb-teeth electrodes include a plurality of electrode fingers extending in a direction orthogonal or substantially orthogonal to the propagation direction of the acoustic waves and disposed side by side in the propagation direction, and are, for example, alternately connecting the plurality of electrode fingers in common. One of the pair of comb-teeth electrodes is connected to the signal terminal, and the other of the pair of comb-teeth electrodes is connected to a ground terminal. In other words, one comb-teeth electrode of each of the IDT electrodes 211 to 215 is connected to the ground, and the other comb-teeth electrode thereof is connected to any one of the signal terminals (input terminal and output terminal) of the overall longitudinally coupled resonance device d1.

The IDT electrodes 211 to 215 configured as described above are alternately connected to one signal terminal (in this case, input terminal) and the other signal terminal (in this case, output terminal) of the overall longitudinally coupled resonance device d1 in the arrangement order. Specifically, among the IDT electrodes 211 to 215, one comb-teeth electrodes of the second IDT electrode 212 and the fourth IDT electrode 214 from the end are connected to the INPUT terminal 111 with the series arm resonator s1 interposed therebetween, and the other comb-teeth electrodes thereof are connected to the ground. On the other hand, among the IDT electrodes 211 to 215, one comb-teeth electrodes of the first IDT electrode 211, the third IDT electrode 213, and the fifth IDT electrode 215 from the end are connected to the OUTPUT terminal 112 with the longitudinally coupled resonance device d2 at the subsequent stage interposed therebetween, and the other comb-teeth electrodes thereof are connected to the ground.

As the IDT electrodes 211 to 215, for example, metal such as Ti, Al, Cu, Pt, Au, Ag, and Pd, an alloy thereof, or a multilayer body thereof may preferably be used.

As described above, in the reception filter 20, each of the parallel arm resonator p1, the longitudinally coupled resonance device d1, and the longitudinally coupled resonance device d2 is defined by the acoustic wave resonators, and the grounds thereof are commonly connected. The impedance of the acoustic wave resonator generally has a capacitive property. In other words, the acoustic wave resonator substantially acts as a capacitive element. For this reason, assuming that a capacitance component of the series arm resonator s1 is $C_{s1}$, a capacitance component of the parallel arm resonator p1 is $C_{p1}$, a capacitance component of the longitudinally coupled resonance device d1 is $C_{d1}$, and a capacitance component of the longitudinally coupled resonance device d2 is $C_{d2}$, an equivalent circuit of the reception filter 20 is represented as illustrated in FIG. 4.

Figure 4:
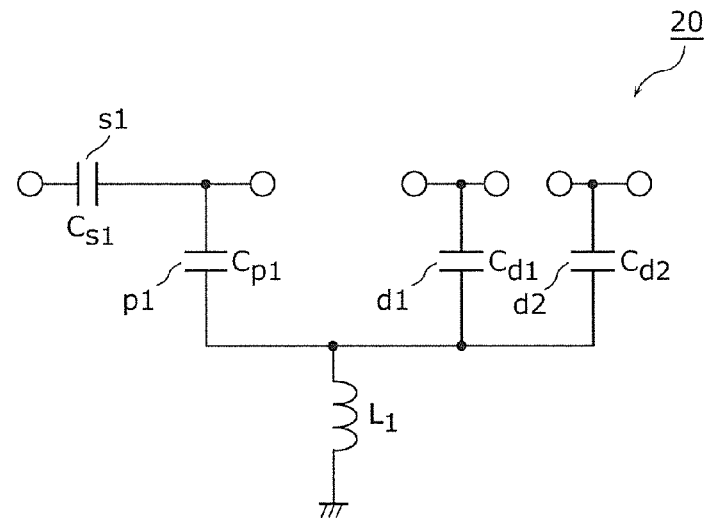
FIG. 4 is an equivalent circuit diagram of a reception filter according to a preferred embodiment of the present invention.

FIG. 4 is an equivalent circuit diagram of the reception filter 20 according to the present preferred embodiment.

As illustrated in FIG. 4, in the reception filter 20, a combined capacitance of the capacitance component $C_{s1}$ of the series arm resonator s1, the capacitance component $C_{p1}$ of the parallel arm resonator p1, the capacitance component Cal of the longitudinally coupled resonance device d1, and the capacitance component $C_{d2}$ of the longitudinally coupled resonance device d2 is connected to the ground potential with an inductance component $L_1$ interposed therebetween.

Here, the inductance component $L_1$ is a combined inductance of an inductance component of the GND wiring 121 connected to the GND terminal 113 and an inductance component of a bonding wire connecting the GND terminal 113 and an external ground potential.

Thus, according to the present preferred embodiment, it is possible to improve the attenuation amount outside the pass band of the reception filter 20, in particular, the attenuation amount on the lower frequency side than the pass band. In addition, it is possible to improve the isolation in the pass band of the transmission filter 10. Hereinafter, these will be described with reference to a comparative example, including circumstances under which preferred embodiments of the present invention have been made.

In general, in an acoustic wave filter device including a plurality of stages of longitudinally coupled resonance devices cascade-connected, grounds of the longitudinally coupled resonance devices of the stages are isolated from each other in order to ensure an attenuation amount outside a pass band. In other words, a configuration is provided in which by providing a plurality of ground terminals on a piezoelectric substrate, a ground terminal connected to the ground of the longitudinally coupled resonance device of the preceding stage and a ground terminal connected to the ground of the longitudinally coupled resonance device of the subsequent stage are isolated from each other. Therefore, when a parallel arm resonator is added to such a configuration, the configuration in which ground of the parallel arm resonator is further isolated is able to be used.

However, in the case in which the plurality of ground terminals are provided while isolating the grounds of all of the longitudinally coupled resonance devices of the stages and the parallel arm resonator as described above, there is a problem that the acoustic wave filter device is increased in size as the number of the ground terminals increases, which prevents miniaturization of the device.

To cope with this problem, a configuration is conceivable in which the grounds of the longitudinally coupled resonance devices of the stages are isolated to ensure the attenuation amount outside the pass band whereas the ground of the parallel arm resonator and ground of any of longitudinally coupled resonance devices of the plurality of stages (e.g., the ground of the longitudinally coupled resonance device of the preceding stage) are shared (commonly connected) to reduce the size of the device.

Figure 5:
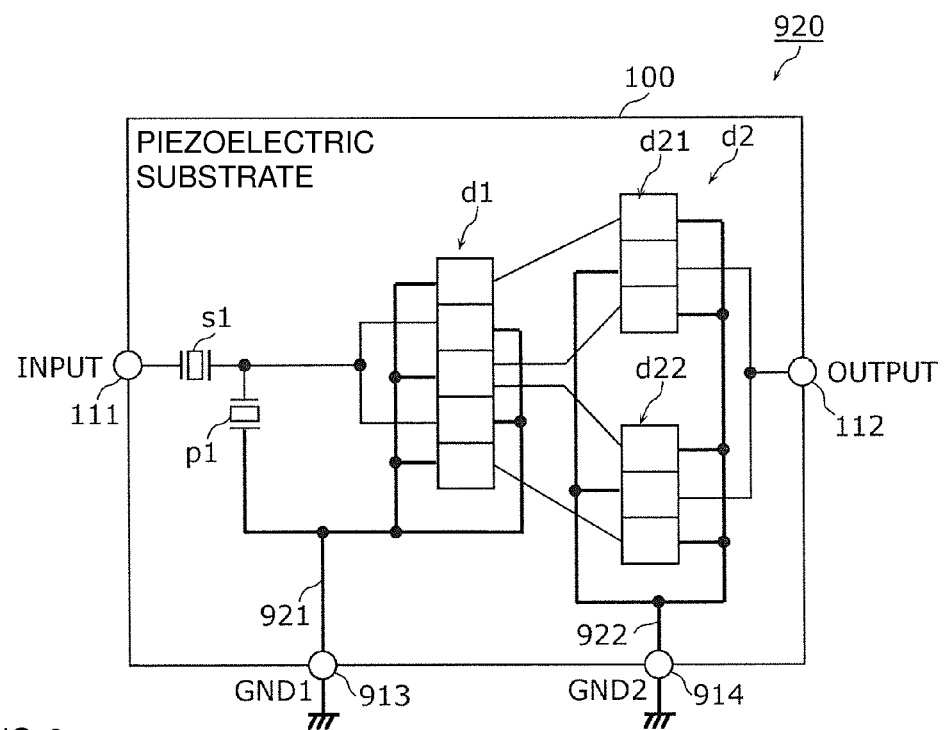
FIG. 5 is a schematic diagram illustrating the configuration of a reception filter according to a comparative example.

FIG. 5 is a schematic diagram illustrating the configuration of a reception filter 920 according to the comparative example configured as described above.

In the reception filter 920 illustrated in FIG. 5, the grounds of the longitudinally coupled resonance devices d1 and d2 cascade-connected are not commonly connected and are isolated from each other unlike the reception filter 20 illustrated in FIG. 2. Therefore, the reception filter 920 includes a plurality of ground terminals (two ground terminals including GND1 terminal 913 and GND2 terminal 914) for external connection.

The ground of the parallel arm resonator p1 and the ground of the longitudinally coupled resonance device d1 of the preceding stage are commonly connected to the GND1 terminal 913 (ground terminal). Specifically, these grounds are connected to each other by a GND wiring 921 connected to the GND1 terminal 913 (ground terminal). On the other hand, the ground of the longitudinally coupled resonance device d2 of the subsequent stage is connected to the GND2 terminal 914. Specifically, the ground is connected to the GND2 terminal 914 by a GND wiring 922 which is not connected to the GND wiring 921.

An equivalent circuit of the reception filter 920 according to the comparative example configured as described above is represented as illustrated in FIG. 6.

Figure 6:
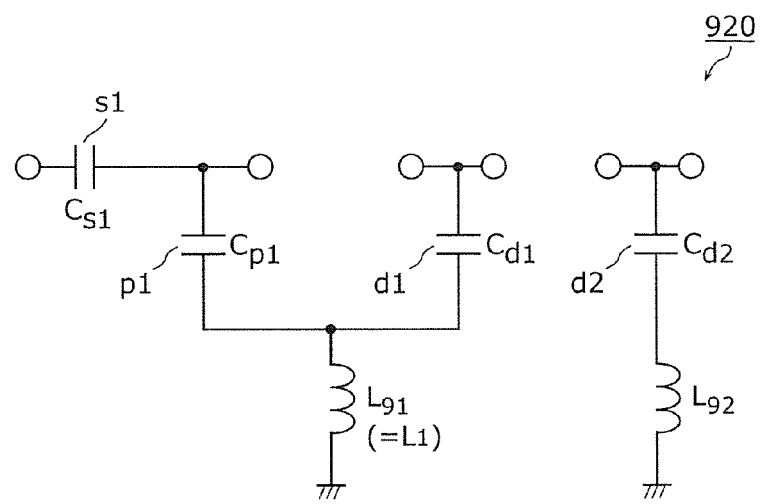
FIG. 6 includes equivalent circuit diagrams of the reception filter according to the comparative example.

FIG. 6 is an equivalent circuit diagram of the reception filter 920 according to the comparative example.

As illustrated in FIG. 6, in the equivalent circuit diagram of the reception filter 920, a combined capacitance of the capacitance component $C_{s1}$ of the series arm resonator s1, the capacitance component $C_{p1}$ of the parallel arm resonator p1, and the capacitance component $C_{d1}$ of the longitudinally coupled resonance device d1 is connected to the ground potential with an inductance component $L_{91}$ interposed therebetween, unlike the equivalent circuit diagram illustrated in FIG. 4. In addition, the capacitance component $C_{d2}$ of the longitudinally coupled resonance device d2 is connected to the ground potential with an inductance component $L_{92}$ interposed therebetween.

The inductance component $L_{91}$ is a combined inductance of an inductance component of the GND wiring 921 connected to the GND1 terminal 913 and an inductance component of a bonding wire connecting the GND1 terminal 913 and the external ground potential. The inductance component $L_{92}$ is a combined inductance of an inductance component of the GND wiring 922 connected to the GND2 terminal 914 and an inductance component of a bonding wire connecting the GND2 terminal 914 and the external ground potential.

Hereinafter, with reference to FIGS. 4 and 6, characteristics of a preferred embodiment of the present invention and the comparative example illustrated in FIGS. 7A and 7B will be compared with each other.

Figure 7A:
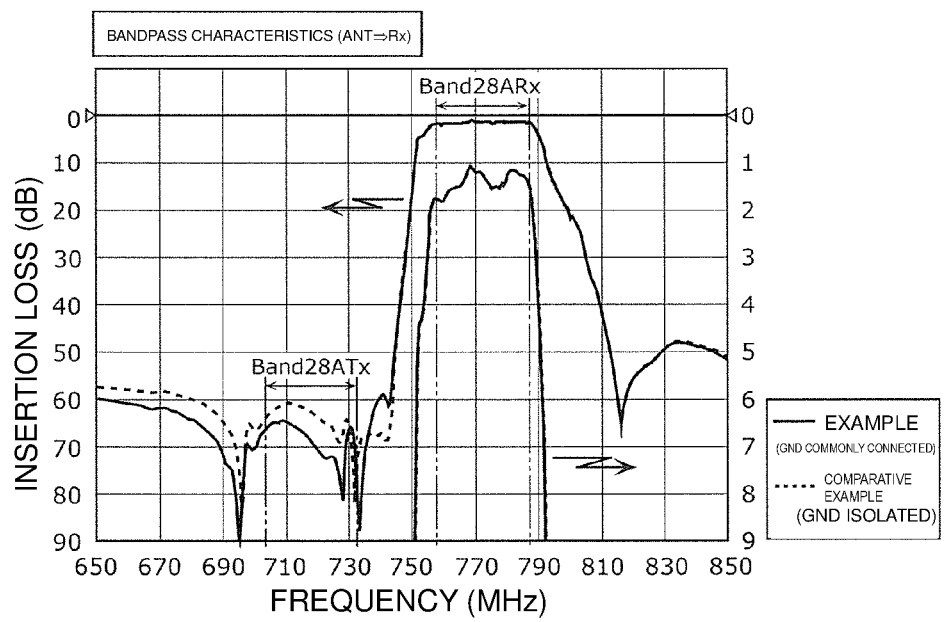
FIG. 7A is a graph illustrating bandpass characteristics of a multiplexer according to a preferred embodiment of the present invention while comparing with the comparative example.

FIG. 7A is a graph illustrating bandpass characteristics of the multiplexer 1 according to the present preferred embodiment while comparing with the comparative example. Specifically, FIG. 7A illustrates insertion loss of the high-frequency signal transmitted from the ANT terminal 11 to the Rx terminal 13, i.e., bandpass characteristics (filter characteristics) of the reception filter. FIG. 7B is a graph illustrating isolation characteristics of the multiplexer 1 according to the above-described preferred embodiment while comparing with the comparative example. Specifically, FIG. 7B illustrates isolation characteristics of the Tx terminal 12 and the Rx terminal 13.

Figure 7B:
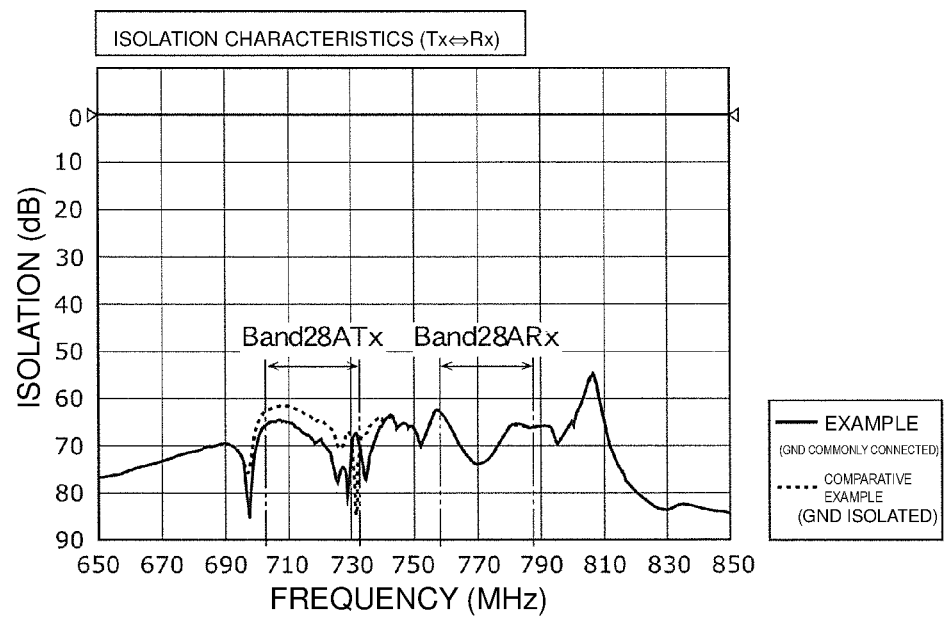
FIG. 7B is a graph illustrating isolation characteristics of a multiplexer according to a preferred embodiment of the present invention while comparing with the comparative example.

In FIGS. 7A and 7B, the characteristics of the present preferred embodiment ("Example" in the drawings) are indicated by solid curves, and the characteristics of the comparative example are indicated by broken curves. It is assumed that a multiplexer according to the comparative example includes the reception filter 920 according to the comparative example, instead of the reception filter 20 according to the present preferred embodiment.

As is apparent from FIG. 7A, when the bandpass characteristics of the present preferred embodiment and the bandpass characteristics of the comparative example are compared with each other, the insertion loss (loss) in the pass band of the reception filter (Rx band of Band 28A) in the present preferred embodiment is equivalent to that in the comparative example. On the other hand, it can be seen that the insertion loss outside the pass band, in particular, on the lower frequency side than the pass band is improved in the present preferred embodiment in comparison with the comparative example. In other words, in the present preferred embodiment, the insertion loss in the pass band of the transmission filter 10 (Tx band of Band 28A) is improved.

Accordingly, as is apparent from FIG. 7B, when the isolation characteristics of the present preferred embodiment and the isolation characteristics of the comparative example are compared with each other, the isolation in the pass band of the reception filter in the present preferred embodiment is equivalent to that in the comparative example, whereas the isolation outside the pass band, in particular, on the lower frequency side than the pass band is improved in the present preferred embodiment in comparison with the comparative example. In other words, in the present preferred embodiment, the isolation in the pass band of the transmission filter 10 is improved.

The reason for this may be described as follows.

The inductance component $L_1$ in the present preferred embodiment illustrated in FIG. 4 and the inductance component $L_{91}$ in the comparative example illustrated in FIG. 6 may be regarded to be equivalent to each other. Therefore, the following relationship is obtained for a resonant frequency relating to these inductance components $L_1$ and $L_{91}$ (hereinafter, referred to as an inductance component L). The resonant frequency related to the inductance component L is a resonant frequency of a circuit constituted of the inductance component L and a capacitance component connected thereto.

In other words, in the present preferred embodiment, a resonant frequency fa is expressed by $1/(2\pi\sqrt{L \cdot (C+C_{d2})})$. On the other hand, in the comparative example, a resonant frequency fb is expressed by $1/(2\pi\sqrt{L \cdot C})$. The capacitance component C is the combined capacitance of the capacitance component $C_{s1}$ of the series arm resonator s1, the capacitance component $C_{p1}$ of the parallel arm resonator p1, and the capacitance component $C_{d1}$ of the longitudinally coupled resonance device d1.

At this time, since $(C+C_{d2})>C$ is satisfied, the resonant frequency fa of the present preferred embodiment and the resonant frequency fb of the comparative example satisfy fa<fb.

That is, from the viewpoint of the equivalent circuit, in the reception filter 20 according to the present preferred embodiment, the capacitance component $C_{d2}$ of the longitudinally coupled resonance device d2 is added to the capacitance component $C_{d1}$ of the longitudinally coupled resonance device d1 in the reception filter 920 according to the comparative preferred embodiment. Therefore, in the present preferred embodiment, the resonant frequency relating to the inductance component L shifts to the lower frequency side, as compared with the comparative example. For each of the reception filters 20 and 920, the resonant frequency defines the attenuation pole on the lower frequency side than the pass band. The attenuation amount at the attenuation pole defined in this manner is increased when shifting to the lower frequency side.

Accordingly, in the present preferred embodiment, it is possible to improve the attenuation amount outside the pass band of the reception filter 20, in particular, the attenuation amount on the lower frequency side than the pass band, as compared with the comparative example. Therefore, in the present preferred embodiment, it is possible to improve the isolation in the pass band (opposite band) of the transmission filter 10 which is commonly connected to the reception filter 20, as compared with the comparative example.

As described above, with the reception filter 20 (acoustic wave filter device) according to the present preferred embodiment, the ground to which the parallel arm resonator p1 is connected, the ground to which at least one (all in the present preferred embodiment) of the plurality of acoustic wave resonators (plurality of first acoustic wave resonators) of the longitudinally coupled resonance device d1 is connected, and the ground to which at least one (all in the present preferred embodiment) of the plurality of acoustic wave resonators (the plurality of second acoustic wave resonators) of the longitudinally coupled resonance device d2 are commonly connected on the piezoelectric substrate 100 (substrate).

With this configuration, it is possible to improve the attenuation amount while shifting, to the low frequency side, the attenuation pole of the reception filter, particularly, the attenuation pole on the lower frequency side than the pass band by the combined inductance component of the inductance component of the commonly connected ground wiring (in the present preferred embodiment, GND wiring 121) and the inductance component of the bonding wire connecting the wiring and the ground potential (in the present preferred embodiment, connecting GND terminal 113 and ground potential) outside the piezoelectric substrate 100. In other words, the inductance components (parallel inductance components) provided between each of the elements (parallel arm resonator p1, longitudinally coupled resonance device d1, and longitudinally coupled resonance device d2) and the ground potential is able to effectively function. Accordingly, it is possible to achieve the small-sized reception filter 20 which is able to improve the attenuation amount outside the pass band.

According to a preferred embodiment of the present invention, the ground to which the parallel arm resonator p1 is connected, the ground to which each of the plurality of acoustic wave resonators (the plurality of first acoustic wave resonators) of the longitudinally coupled resonance device d1 is connected, and the ground to which each of the plurality of acoustic wave resonators (the plurality of second acoustic wave resonators) of the longitudinally coupled resonance device d2 is connected are commonly connected on the piezoelectric substrate 100.

With this configuration, it is possible to achieve the small-sized reception filter 20 which is able to further improve the attenuation amount outside the pass band.

In addition, according to a preferred embodiment of the present invention, the longitudinally coupled resonance device d2 includes the longitudinally coupled resonance device d21 (third longitudinally coupled resonance device) and the longitudinally coupled resonance device d22 (fourth longitudinally coupled resonance device), which are connected in parallel. The ground to which at least one (in the above-described preferred embodiment, all) of the acoustic wave resonators of the longitudinally coupled resonance device d21 is connected and the ground to which at least one (in the above-described preferred embodiment, all) of the acoustic wave resonators of the longitudinally coupled resonance device d22 is connected are commonly connected on the piezoelectric substrate 100.

With this configuration, even when the longitudinally coupled resonance device d2 include a plurality of longitudinally coupled resonance devices connected in parallel to each other (that is, is divided in parallel), the small-sized reception filter 20 which is able to improve the attenuation amount outside the pass band is achieved.

The reception filter 20 according to the above-described preferred embodiment includes the series arm resonator s1 connected to the parallel arm resonator p1 with no acoustic wave resonator interposed therebetween.

With this configuration, the characteristics of the ladder circuit are added to the characteristics of the longitudinally coupled resonance devices d1 and d2 cascade-connected, so that it is possible to improve the attenuation characteristics outside the pass band, such as obtaining steep attenuation characteristics.

Further, the duplexer 1 (multiplexer) according to a preferred embodiment includes the above-described reception filter 20. Therefore, it is possible to improve the isolation in the pass band of the transmission filter 10 (the opposite band of the reception filter 20). In other words, it is possible to achieve the small-sized duplexer 1 which is able to improve the isolation characteristics.

One end of the series arm resonator s1 is connected to the ANT terminal 11 (common connection point) with no acoustic wave resonator interposed therebetween, and the other end of the series arm resonator s1 is connected to the parallel arm resonator p1. By providing the series arm resonator s1 at a position closest to the ANT terminal 11 among the plurality of acoustic wave resonators of the reception filter 20, it is possible to further improve the isolation in the pass band of the transmission filter (the opposite band of the reception filter 20).

While the acoustic wave filter device and the multiplexer according to the above-described preferred embodiments of the present invention have been described, the present invention is not limited to the preferred embodiments. Other preferred embodiments obtained by combining desired components in the above-described preferred embodiments, variations made by performing, on the above-described preferred embodiments, various modifications at which those skilled in the art may achieve without departing from the gist of the present invention, and various types of apparatuses including the acoustic wave filter device and the multiplexer according to preferred embodiments of the present invention are also encompassed in the present invention.

For example, a high frequency module (high-frequency front end circuit) and a communication apparatus including an acoustic wave filter device and a multiplexer according to a preferred embodiment of the present invention are also encompassed in the present invention.

The duplexer including one transmission filter device and one reception filter device has been described above as an example of the multiplexer. However, the multiplexer may be, for example, a receiving multiplexer including a plurality of reception filter devices. Also, the multiplexer may include equal to or more than three filter devices, and may be, for example a triplexer including three filter devices or a quadplexer including four filters.

The acoustic wave filter device has been described above using the reception filter 20 as an example. However, the configuration of the above-described acoustic wave filter device may be used for a transmission filter. Therefore, the INPUT terminal 111 (first terminal) described above may be a terminal to output the high-frequency signal, and the above-described OUTPUT terminal 112 (second terminal) may be a terminal to which the high-frequency signal is input.

However, since the longitudinally coupled resonance device generally has low electric power handling capability, it is preferable that the configuration of the above-described acoustic wave filter device is used for the reception filter which filters the high-frequency reception signal as a high-frequency signal with small power.

Further, the acoustic wave filter device may include a single filter, instead of the filter defining the multiplexer such as the duplexer 1. In such a configuration, at least one of the series arm resonator s1 and the parallel arm resonator p1 is not limited to being provided between the longitudinally coupled resonance devices d1 and d2 cascade-connected and the INPUT terminal 111, and may be provided between the longitudinally coupled resonance devices d1 and d2 and the OUTPUT terminal 112. In this configuration, it is not necessary to provide the series arm resonator s1.

In the above description, the ground to which the parallel arm resonator p1 is connected, the ground to which all of the plurality of acoustic wave resonators (the plurality of first acoustic wave resonators) of the longitudinally coupled resonance device d1 (first longitudinally coupled resonance device) are connected, and the ground to which all of the plurality of acoustic wave resonators (the plurality of second acoustic wave resonators) of the longitudinally coupled resonance device d2 (second longitudinally coupled resonance device) are connected are commonly connected on the piezoelectric substrate 100. However, the ground to which a portion of the plurality of acoustic wave resonators of the longitudinally coupled resonance device d1 is connected and the ground to which a portion of the plurality of acoustic wave resonators of the longitudinally coupled resonance device d2 is connected may not be commonly connected on the piezoelectric substrate 100. In other words, these grounds may be isolated from each other on the piezoelectric substrate 100.

In addition, in the above description, the longitudinally coupled resonance device d2 includes the longitudinally coupled resonance devices d21 and d22 connected in parallel to each other, but may include, for example, one longitudinally coupled resonance device including the same number of acoustic wave resonators as that of the longitudinally coupled resonance device d1.

In the above description, only the configuration of longitudinally coupled resonance device d22 of the subsequent stage of the longitudinally coupled resonance device d21 of the preceding stage and the longitudinally coupled resonance device d22 of the subsequent stage is divided in parallel are described. However, only the longitudinally coupled resonance device d21 of the preceding stage or both of the longitudinally coupled resonance device d21 of the preceding stage and the longitudinally coupled resonance device d22 of the subsequent stage may be divided in parallel.

In the above description, the grounds of all of the acoustic wave resonators of the longitudinally coupled resonance device d21 and the grounds of all of the acoustic wave resonators of the longitudinally coupled resonance device d22 are commonly connected on the piezoelectric substrate 100. However, the ground to which a portion of the plurality of acoustic wave resonators of the longitudinally coupled resonance device d21 is connected and the ground to which a portion of the plurality of acoustic wave resonators of the longitudinally coupled resonance device d22 is connected may not be commonly connected on the piezoelectric substrate 100. In other words, these grounds may be isolated from each other on the piezoelectric substrate 100.

Preferred embodiments of the present invention are widely applicable to communication devices, such as a cellular phone, for example as a small-sized acoustic wave filter device and a multiplexer which are able to improve an attenuation amount outside a pass band.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter device comprising:
a parallel arm resonator connected between a ground and a transmission path of a high-frequency signal, which connects a first terminal and a second terminal to or from which the high-frequency signal is input or output;
a first longitudinally coupled resonance device including a plurality of first acoustic wave resonators disposed side by side in a propagation direction of acoustic waves and provided on the transmission path; and
a second longitudinally coupled resonance device including a plurality of second acoustic wave resonators disposed side by side in the propagation direction of the acoustic waves and cascade-connected to the first longitudinally coupled resonance device; wherein
each of the plurality of first acoustic wave resonators and each of the plurality of second acoustic wave resonators includes a first end connected to the ground;
the parallel arm resonator, the first longitudinally coupled resonance device, and the second longitudinally coupled resonance device are provided on one substrate having piezoelectricity; and
all of the grounds on the substrate, including the ground to which the parallel arm resonator is connected, the ground to which each of the plurality of first acoustic wave resonators is connected, and the ground to which each of the plurality of second acoustic wave resonators is connected, are commonly connected to one ground terminal on the substrate.

2. The acoustic wave filter device according to claim 1, wherein
the second longitudinally coupled resonance device is defined by a third longitudinally coupled resonance device and a fourth longitudinally coupled resonance device which are connected in parallel to each other on the transmission path;
the third longitudinally coupled resonance device includes a portion of the plurality of second acoustic wave resonators;
the fourth longitudinally coupled resonance device includes at least another portion of the plurality of second acoustic wave resonators;
the ground to which at least one of the plurality of second acoustic wave resonators that the third longitudinally coupled resonance device includes is connected and the ground to which at least one of the plurality of second acoustic wave resonators that the fourth longitudinally coupled resonance device includes is connected are commonly connected on the substrate.

3. The acoustic wave filter device according to claim 1, wherein each of the plurality of first acoustic wave resonators and each of the plurality of second acoustic wave resonators include InterDigital Transducer electrodes to excite surface acoustic waves.

4. The acoustic wave filter device according to claim 1, further comprising a series arm resonator provided on the transmission path and connected to the parallel arm resonator with no acoustic wave resonator interposed therebetween.

5. A multiplexer comprising:
a plurality of filter devices that are commonly connected at a common connection point; wherein
the plurality of filter devices include the acoustic wave filter device according to claim 1; and
the first terminal is connected to the common connection point.

6. The multiplexer according to claim 5, wherein
the second longitudinally coupled resonance device is defined by a third longitudinally coupled resonance device and a fourth longitudinally coupled resonance device which are connected in parallel to each other on the transmission path;
the third longitudinally coupled resonance device includes a portion of the plurality of second acoustic wave resonators;
the fourth longitudinally coupled resonance device includes at least another portion of the plurality of second acoustic wave resonators;
the ground to which at least one of the plurality of second acoustic wave resonators that the third longitudinally coupled resonance device includes is connected and the ground to which at least one of the plurality of second acoustic wave resonators that the fourth longitudinally coupled resonance device includes is connected are commonly connected on the substrate.

7. The multiplexer according to claim 5, wherein each of the plurality of first acoustic wave resonators and each of the plurality of second acoustic wave resonators include Inter-Digital Transducer electrodes to excite surface acoustic waves.

8. A multiplexer comprising:
a plurality of filter devices that are commonly connected at a common connection point; wherein
the plurality of filter devices include the acoustic wave filter device according to claim 5;
the first terminal is connected to the common connection point; and
the series arm resonator includes one end connected to the first terminal with no acoustic wave resonator interposed therebetween and another end connected to the parallel arm resonator.

9. The multiplexer according to claim 8, wherein
the second longitudinally coupled resonance device is defined by a third longitudinally coupled resonance device and a fourth longitudinally coupled resonance device which are connected in parallel to each other on the transmission path;
the third longitudinally coupled resonance device includes a portion of the plurality of second acoustic wave resonators;
the fourth longitudinally coupled resonance device includes at least another portion of the plurality of second acoustic wave resonators;
the ground to which at least one of the plurality of second acoustic wave resonators that the third longitudinally coupled resonance device includes is connected and the ground to which at least one of the plurality of second acoustic wave resonators that the fourth longitudinally coupled resonance device includes is connected are commonly connected on the substrate.

10. The multiplexer according to claim 8, wherein each of the plurality of first acoustic wave resonators and each of the plurality of second acoustic wave resonators include Inter-Digital Transducer electrodes to excite surface acoustic waves.

11. The multiplexer according to claim 5, wherein the plurality of filter devices include a transmission filter and a reception filter having different pass bands.

12. The multiplexer according to claim 11, wherein the pass band of the transmission filter is about 703 MHz to about 733 MHz, and the pass band of the reception filter is about 758 MHz to about 788 MHz.

13. The multiplexer according to claim 8, wherein the plurality of filter devices include a transmission filter and a reception filter having different pass bands.

14. The multiplexer according to claim 13, wherein the pass band of the transmission filter is about 703 MHz to about 733 MHz, and the pass band of the reception filter is about 758 MHz to about 788 MHz.

* * * * *